(12) United States Patent
Henke et al.

(10) Patent No.: US 7,462,426 B2
(45) Date of Patent: Dec. 9, 2008

(54) METHOD FOR PRODUCING A PHASE MASK

(75) Inventors: Wolfgang Henke, Radebeul (DE);
Gerhard Kunkel, Radebeul (DE)

(73) Assignee: Infineon Technologies AG, Munich (DE)

( * ) Notice: Subject to any disclaimer, the term of this patent is extended or adjusted under 35 U.S.C. 154(b) by 629 days.

(21) Appl. No.: 11/056,402

(22) Filed: Feb. 14, 2005

(65) Prior Publication Data
US 2005/0196683 A1 Sep. 8, 2005

Related U.S. Application Data

(63) Continuation of application No. PCT/DE03/02739, filed on Aug. 14, 2003.

(30) Foreign Application Priority Data
Aug. 14, 2002 (DE) .............................. 102 37 344

(51) Int. Cl.
*G03F 1/00* (2006.01)
*G03C 5/00* (2006.01)
(52) U.S. Cl. .......................................... 430/5; 430/394
(58) Field of Classification Search ............... 430/5, 430/394, 322–323
See application file for complete search history.

(56) References Cited

U.S. PATENT DOCUMENTS

| 5,126,006 | A | 6/1992 | Cronin et al. |
| 5,288,569 | A | 2/1994 | Lin |
| 5,480,747 | A | 1/1996 | Vasudev |
| 5,750,290 | A * | 5/1998 | Yasuzato et al. ................ 430/5 |
| 5,789,116 | A | 8/1998 | Kim |
| 5,851,706 | A | 12/1998 | Lim et al. |
| 6,207,333 | B1 | 3/2001 | Adair et al. |
| 6,902,852 | B2 * | 6/2005 | Watanabe ....................... 430/5 |
| 2001/0021476 | A1 | 9/2001 | Gans et al. |
| 2002/0015899 | A1 | 2/2002 | Chen et al. |
| 2002/0132173 | A1 | 9/2002 | Rolfson |

FOREIGN PATENT DOCUMENTS

| DE | 100 06 952 A1 | 8/2001 |
| EP | 0 567 169 A1 | 10/1993 |
| EP | 1 176 465 A2 | 1/2002 |

* cited by examiner

*Primary Examiner*—Stephen Rosasco
(74) *Attorney, Agent, or Firm*—Edell, Shapiro & Finnan, LLC

(57) ABSTRACT

A first and a second phase-shifting, semitransparent layer are formed on a substrate. The layers are patterned lithographically to form first elevated structure elements on the substrate with a first degree of transmission and second structure elements with a second degree of transmission, where the second degree of transmission is different from the first degree of transmission. Memory products can be produced with high resolution and high dimensional accuracy when the structure elements are transferred to a semiconductor substrate, by virtue of dense structure arrangements being represented by the structure elements with a high degree of transmission of more than 30% and, on the same mask, isolated structure arrangements having a low density being represented by the structure elements with a lower degree of transmission.

15 Claims, 2 Drawing Sheets

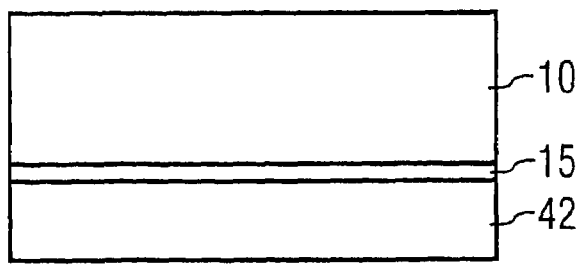
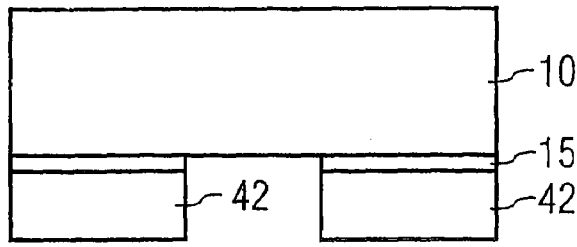
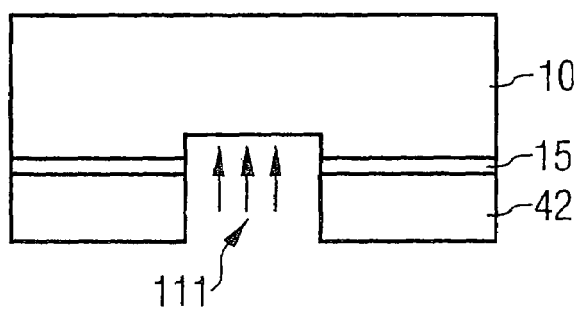
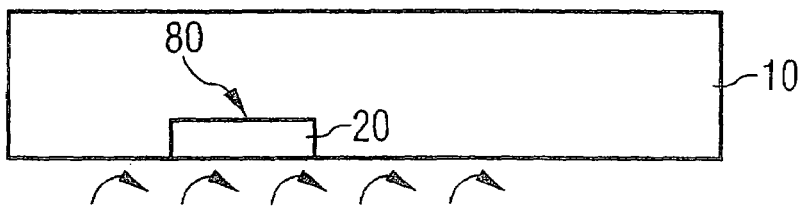
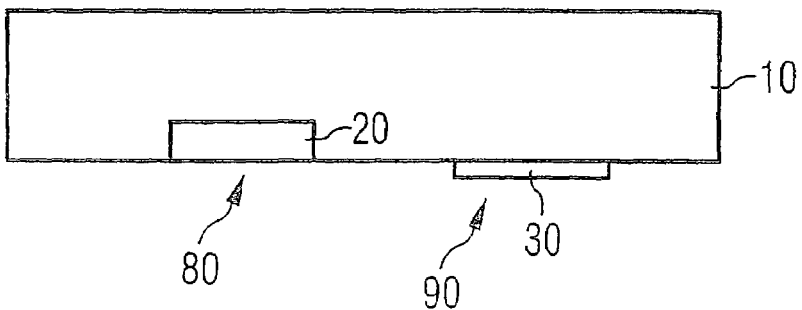

METHOD FOR PRODUCING A PHASE MASK

CROSS REFERENCE TO RELATED APPLICATIONS

This application is a continuation of PCT/DE03/02739, filed Aug. 14, 2003, and titled "Method for the Production of a Phase Mask," which claims priority under 35 U.S.C. §119 to German Application No. DE 10237344.2, filed on Aug. 14, 2002, and titled "Method for the Production of a Phase Mask," the entire contents of which are hereby incorporated by reference.

FIELD OF THE INVENTION

The present invention relates to a method for producing a phase mask, and in particular to a method for producing an attenuated phase shift mask, for the projection or reflection of a structure into an image plane.

BACKGROUND

Masks or reticles are used in the field of semiconductor fabrication in order to form a pattern of structure elements in a photosensitive resist by means of lithographic projection onto a semiconductor wafer coated with the photosensitive resist. The choice of the lateral extent of the structure elements to be formed on the semiconductor wafer is restricted due to a predetermined lower resolution limit predetermined for a particular projection system. The resolution limit depends on factors such as the exposure wavelength, the aperture size of the lens system, or, for example, on the type of illumination source of the projection system.

However, the resolution limit of a projection system can also be reduced by the use of modern lithographic techniques in the case of the masks used for exposure. Besides optical proximity correction (OPC) and/or the use of sublithographic structure elements in the vicinity of structure elements to be imaged, this primarily relates to the field of phase masks, which are also called phase shift masks.

One particular type is the so-called attenuated phase shift mask. The structure elements formed on conventional chromium masks as opaque layers on a transparent carrier substrate are embodied in semitransparent and phase-shifting fashion in the case of the attenuated masks. The term "semi-transparent" is somewhat misleading since the degree of transmission, i.e., that proportion of the incident light which can penetrate through the semitransparent layer and reach the transparent carrier substrate, usually amounts to between only 3% and 8% of the intensity of the incident light beam. This intensity does not suffice to expose through the photo-sensitive resist at the corresponding position on the semiconductor wafer. On the other hand, the light beam that is subjected to a phase deviation of typically 180° and is attenuated on account of the low degree of transmission brings about an increased contrast enhancement compared with conventional chromium structure elements at the edges of transparent and semitransparent partial regions. In the case of attenuated phase shift masks, therefore, semitransparent structure elements can be imaged with high dimensional accuracy on a semiconductor wafer.

However, one particular problem, in the case of attenuated phase shift masks, is that the contrast-enhancing effect for dense regions of structure elements differs from that of isolated structure elements. In general, it is therefore attempted to simulate, with the aid of sublithographic structures, the presence of high densities in the vicinity of isolated structure elements. However, this gives rise to the problem of a disadvantageous increase in the expenditure on costs for the design and for the production of the mask on account of the very small writing grids for the laser or electron beam.

SUMMARY OF THE INVENTION

An object of the present invention is to provide a method for imaging dense and isolated structure arrangements onto a semiconductor wafer jointly with high dimensional accuracy using the technology of attenuated phase shift masks.

Another object of the present invention is to sufficiently reduce the resolution limit for the imaging of dense structure arrangements for a given projection system.

The above and further objects are achieved individually and/or in combination, and it is not intended that the present invention be construed as requiring two or more of the objects to be combined unless expressly required by the claims attached hereto.

In accordance with the present invention, a method for producing a phase mask for the projection or reflection of a structure into an image plane comprises the steps of: providing a substrate as carrier; forming a first semitransparent layer on the substrate, the first semitransparent layer being configured to add a first phase rotation to a light beam passing through the layer; forming a second transparent layer on the first semitransparent layer, the second semitransparent layer being configured to add a second phase rotation to a light beam passing through the layer; removing portions of the first and the second semitransparent layers in the vicinity of at least two partial regions on the substrate so as to form at least two elevated first structure elements on the substrate, where each of the first structure elements comprises the first and the second semitransparent layers with a first degree of transmission; and removing the second semitransparent layer in one of the at least two partial regions so as to form a second structure element with a second degree of transmission that differs from the first degree of transmission of the first structure element.

In another embodiment of the present invention, a method for producing a phase mask for the projection or reflection of a structure into an image plane comprises the steps of: providing a substrate as a carrier; forming a first semitransparent layer with a first degree of transmission on the substrate, the first semitransparent layer being configured to add a first phase rotation to a light beam passing through the layer; removing the first semitransparent layer in a first partial region on the substrate so as to form a first elevated structure element on the substrate comprising the first semitransparent layer with the first degree of transmission; forming a second semitransparent layer with a second degree of transmission on the substrate, the second semitransparent layer being configured to add a second phase rotation to a light beam passing through the layer, and the second degree of transmission differing from the first degree of transmission; removing the second semitransparent layer in a second partial region on the substrate so as to form at least one second elevated structure element on the substrate comprising the second semitransparent layer with the second degree of transmission.

The above and still further objects, features and advantages of the present invention will become apparent upon consideration of the following detailed description of specific embodiments thereof, particularly when taken in conjunction with the accompanying drawing.

BRIEF DESCRIPTION OF THE DRAWINGS

FIGS. 2A-2E depict a sequence for producing first and second structure elements having a different degree of transmission in accordance with a second exemplary embodiment of the present invention.

DETAILED DESCRIPTION

Figure 1A:
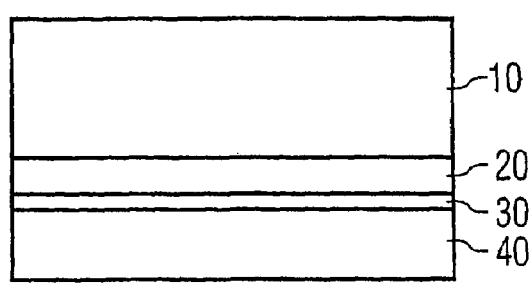
FIGS. 1A-1E depict a sequence for producing first and second structure elements having a different degree of transmission in accordance with a first exemplary embodiment of the present invention.

In accordance with the present invention, a phase mask is produced by forming at least one first structure element with a first degree of transmission and at least one second structure element with a second degree of transmission on a substrate as carriers. In accordance with a first embodiment of the invention, this is achieved by virtue of the first structure elements being constructed from two semitransparent layers, arranged one above the other and in elevated fashion on the substrate, while the second structure elements are each case constructed from only one semitransparent layer. Both the first and second structure elements in this embodiment include a common semitransparent layer. Thus, the first structure elements have an additional semitransparent layer, and their composite degree of transmission is lower, in comparison with the second structure elements.

In accordance with a second embodiment of the present invention, the semitransparent layers are formed on a substrate, followed by progressively forming of structure elements by lithography, where portions of the semitransparent layers are removed in partial regions surrounding the structure elements on the substrate. Preferably, the structure elements, which emerge as a result of the removal of portions of the first and the second semitransparent layers, are formed next to one another and not on top of one another, although this case is not precluded in accordance with the present invention. In situations in which first and second semitransparent layers overlap each other, it is possible to form structure elements with multiple (e.g., three or more) different degrees of transmission.

The first and second semitransparent layers preferably have different degrees of transmission, so that the first and second structure elements also have different degrees of transmission. The degrees of transmission for any structure elements formed in accordance with the invention can be achieved by selection of a suitable material for the semitransparent layer forming a particular structure element and/or by selection of a suitable and precisely dimensioned layer thickness. According to the invention, thin layers of materials that are essentially nontransparent to light (i.e. opaque in the case of conventionally used layer thicknesses) are referred to herein as semitransparent if their thickness is so small that their light transmissivity leads to a contrast-enhancing effect in the image plane. This is the case, for example, for a chromium layer having a thickness of 10 nm, while chromium is also used as material for the otherwise opaque layers on the conventional, non-phase-shifting chromium masks.

In a non-limiting example, molybdenum silicide is used as a material for the first semitransparent layer. Chromium or silver, for example, can also used as material for the second semitransparent layer.

When forming a transmission mask in accordance with the present invention, the substrate is preferably transparent. Quartz is preferably the material used to form the substrate. When forming a reflection mask in accordance with the present invention, the substrate can include silicon, for example, formed by a layer stack covered with an alternating arrangement of layers for reflecting incident radiation. For example, the layer stack can include layers of molybdenum silicide and silicon.

The first and second structure elements can be used with different degrees of transmission in order to be able to image dense and isolated structure arrangements jointly in one exposure step with high dimensional accuracy (e.g., on a semiconductor substrate in the image plane).

It has been determined that structure arrangements with a particularly high structure density, such as, for example, line-gap structure arrangements with a lateral extent that is close to the resolution limit, can be imaged with particular dimensional accuracy. This is the case, in particular, if the lines to be formed on the semiconductor substrate are produced by structure elements on the mask with a comparatively high degree of transmission (e.g., more than 15%, and in certain preferred instances 30% or greater).

However, certain circuits, such as memory products, which are intended to be produced with the aid of a set of masks usually have isolated structure arrangements. One particular example relates to the terminals in the periphery of a memory cell array. These isolated structure arrangements or elements would lead to a disadvantageous effect of so-called side lobe printing in the case of such a high degree of transmission. This effect is particularly pronounced in the case of isolated structure elements with a lateral extent of the order of magnitude of the resolution limit of the projection system. The side lobes represent artifacts of the structure elements arising on the semiconductor substrate, which are additionally amplified by lens aberrations of higher orders.

The formation of first structure elements with a lower degree of transmission for the production of isolated structures on the semiconductor substrate and second structure elements with a high degree of transmission for forming structure elements in dense structure arrangements on the semiconductor substrate, in accordance with the present invention, therefore results in a particularly advantageous, dimensionally accurate imaging of structure arrangements (in particular for the production of memory products). In accordance with these advantageous configurations of the present invention, structure elements with a different degree of transmission are spaced apart from one another, since isolated structure arrangements and dense structure arrangements are also separate from one another.

An exemplary method in accordance with the present invention for producing a mask including first and second structure elements with a different degree of transmission is depicted in FIGS. 1A-1E. Referring to FIG. 1A, a quartz substrate 10 is coated with a first semitransparent layer 20 including molybdenum silicide, which has a degree of transmission of 18% and adds a phase shift of 180° to the electromagnetic waves of an incident light beam. A second semitransparent layer 30 made of chromium having a thickness of 10 nm is arranged on the first semitransparent layer 20. The second semitransparent layer 30 has a degree of transmission of 36% and additionally adds a phase shift of 360° to the electromagnetic waves of the incident light beam. A resist 40 that is photosensitive toward UV light is then applied on the second semitransparent layer 30.

Figure 1B:
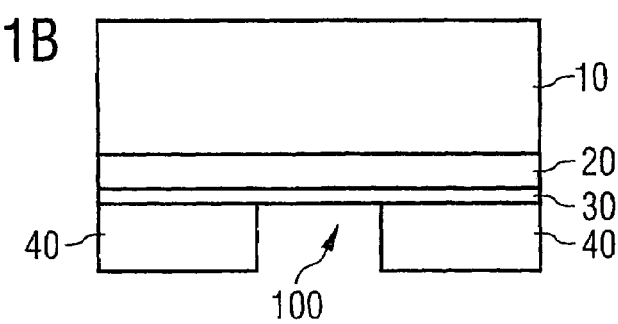
Figure 1C:
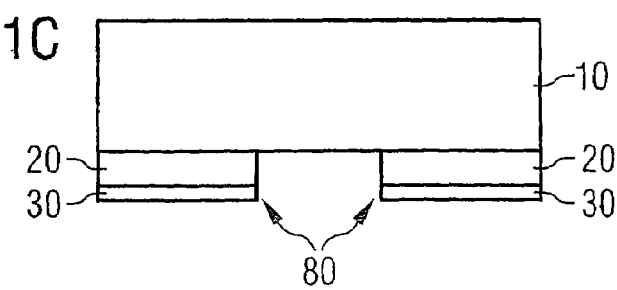

The resist 40 is exposed to a light beam having a wave length of 248.4 nm in a partial region 100 and subsequently developed as depicted in FIG. 1B. In an etching step, the partial region 100 formed as an opening in the resist 40 is transferred into the first and second semitransparent layers 20, 30. The resist 40 is subsequently removed, resulting in the formation of first structures 80 as depicted in FIG. 1C. In particular, first structures 80 including the first and second semitransparent layers 20, 30 are now situated on the substrate 10. The etching step for transferring the opening in the resist 40 into the semitransparent layers can be implemented in two steps, namely, in a first etching step for the chromium and in a second etching step for the molybdenum silicide.

Figure 1D:
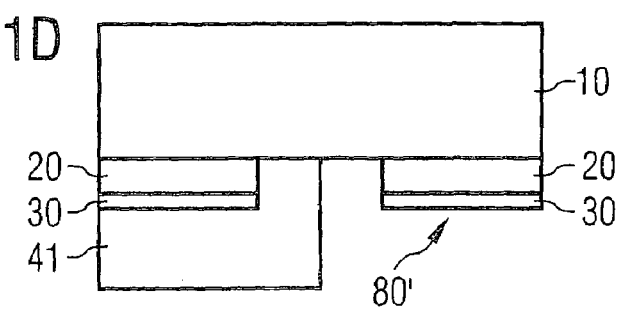

A second resist 41 is applied to the mask and exposed in a manner dependent on the structure density (as determined from the design data of the circuit) on the mask as depicted in FIG. 1D. For example, parts of the substrate are exposed in which a high structure density is present. In an exemplary embodiment, a mask is constructed for forming gate contacts or word lines for driving memory cells in a memory cell array. The region of the gate contacts or word lines has a high structure density, so that the resist 41 as a positive resist exposes the region of these word lines and is subsequently developed. By contrast, the structure elements 80 that are arranged in isolated fashion on the substrate are not exposed in this exposure step.

Figure 1E:
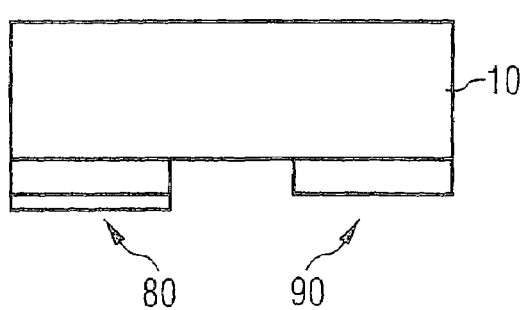

The structure element 80' that is not masked by the resist 41, as depicted in FIG. 1D, is then exposed to a chromium etching step, so that the second semitransparent layer 30 is removed from the structure element. A structure element 90 is then formed, as depicted in FIG. 1E, that has only the first semitransparent layer 10 including molybdenum silicide with a degree of transmission of 18%. After the removal of the resist 41, the first structure element 80 is now uncovered on the substrate 10 and, as a result of the multiple degrees of transmission of its two semitransparent layers 20, 30, has a second degree of transmission of 6%.

A second exemplary embodiment of producing a mask in accordance with the present invention is depicted in FIGS. 2A-2E. Referring to FIG. 2A, a thin chromium layer 15 is arranged on a substrate 10 made of quartz, followed by coating the layer 15 with a resist 42. A partial region in the resist 42 is exposed and developed. In a chromium etching step, the exposed structure is transferred into the chromium layer 15 as depicted in FIG. 2B. Using the chromium layer 15 as a hard mask, a quartz etching step is subsequently carried out to form a depression 111 in the substrate 10 as depicted in FIG. 2C.

After removal of the resist 42 from the surface of the chromium layer 15, a first semitransparent layer 20 is formed in the depression 111 of the substrate 10. Subsequent to removing the resist 42, a chemical mechanical polishing technique is carried out, where the surface of the mask is then planarized and at least the chromium layer 15 and a portion of the semitransparent layer 20, and possibly even a portion of the quartz material, are removed until the quartz material of the substrate 10 outside the depression 111 again forms a surface that terminates in planar manner with the adajent surface of the first semitransparent layer 20 in the filled depression 111. The material of the first semitransparent layer 20 is molybdenum silicide, which has a degree of transmission of 18% and forms a first structure element 80. A plurality of structure elements 80 can be formed in this manner along the substrate.

The phase shift that is added to an incident light beam by the resulting structure elements 80 is calculated based upon the etched-back quartz material and the additional material of the first semitransparent layer 20 including molybdenum silicide. The depression 111 is dimensioned in such a way that a phase shift of 180° results from the reduced quartz thickness and the additional thickness of the molybdenum silicide.

The mask is further processed to form a second semitransparent layer 30 and a further resist are applied to the substrate. The second semitransparent layer 30 includes a thin silver layer. The further resist is exposed in order to form a plurality of structure elements 90, which serve for forming word lines in a dense memory cell array on a semiconductor wafer. The thin silver layer has a degree of transmission of 36%. The structure elements 80 including the first semitransparent layer 20 correspond to the terminals of the word lines in a periphery of the memory cell array.

While the invention has been described in detail and with reference to specific embodiments thereof, it will be apparent to one skilled in the art that various changes and modifications can be made therein without departing from the spirit and scope thereof. It is therefore to be understood that all such variations, modifications and changes are believed to fall within the scope of the present invention as defined by the appended claims and their equivalents.

What is claimed is:

1. A method for producing a phase mask for the projection or reflection of a structure into an image plane, comprising:
   providing a substrate;
   forming a first semitransparent layer on the substrate, wherein the first semitransparent layer is configured to add a first phase rotation to a light beam passing through the first semitransparent layer;
   forming a second semitransparent layer on the first semitransparent layer, wherein the second semitransparent layer is configured to add a second phase rotation to a light beam passing through the second semitransparent layer;
   removing selected portions of the first and the second semitransparent layers in the vicinity of at least two partial regions on the substrate so as to form at least two first structure elements at the at least two partial regions of the substrate, wherein each of the first structure elements comprises the first and second semitransparent layers and has a first degree of transmission; and
   removing the second semitransparent layer at one of the at least two partial regions so as to form a second structure element with a second degree of transmission, wherein the second degree of transmission differs from the first degree of transmission.

2. The method of claim 1, wherein the first semitransparent layer comprises molybdenum silicide.

3. The method of claim 1, wherein the second semitransparent layer comprises at least one of chromium and silver.

4. The method of claim 1, wherein the first degree of transmission is more than 15%.

5. The method of claim 1, wherein the second degree of transmission is more than 30%.

6. The method of claim 1, wherein at least two first structure elements are formed with a minimum lateral extent and a selected distance from one another, the distance being more than twice the minimum lateral extent.

7. The method of claim 1, wherein at least two second structure elements are formed with a minimum lateral extent and a selected distance from one another, the distance being equal to the minimum lateral extent.

8. The method of claim 7, wherein a multiplicity of second structure elements are formed on the substrate, said second structure elements being arranged as a periodic line-gap pattern on the substrate.

9. The method of claim 1, further comprising:
   producing a memory chip by exposure of the first and second structure elements.

10. A method for producing a phase mask for the projection or reflection of a structure into an image plane, comprising:
    providing a substrate;

forming a first semitransparent layer with a first degree of transmission at least partially directly on the substrate, wherein the first semitransparent layer is configured to add a first phase rotation to a light beam passing through the first semitransparent layer;

removing the first semitransparent layer in a first partial region on the substrate so as to form a first structure on the substrate comprising the first semitransparent layer with the first degree of transmission;

forming a second semitransparent layer with a second degree of transmission at least partially directly on the substrate, wherein the second semitransparent layer is configured to add a second phase rotation to a light beam passing through the layer, the second degree of transmission differing from the first degree of transmission; and removing the second semitransparent layer in a second partial region on the substrate so as to form at least one second elevated structure element on the substrate comprising the second semitransparent layer with the second degree of transmission.

11. The method of claim 10, wherein the forming the first semitransparent layer comprises etching the substrate to form a depression, and filling the depression with the first semitransparent layer.

12. The method of claim 11, wherein the removal of the first semitransparent layer is accomplished at least in part via chemical mechanical polishing.

13. A phase mask for the projection or reflection of a structure into an image plane, the phase mask comprising a substrate, a first structure element supported by the substrate and comprising at least one semitransparent material, the first structure element having a first degree of transmission, and a second structure element supported by the substrate and comprising at least one semitransparent material, the second structure element having a second degree of transmission that is different from the first degree of transmission, wherein the first structure element includes a first semitransparent layer that is disposed on the substrate and comprises a first material that is configured to add a first phase rotation to a light beam passing through the first semitransparent layer, the first structure element further comprises a second semitransparent layer that is disposed on the substrate and comprises a second material that is configured to add a second phase rotation to a light beam passing through the second semitransparent layer, and the second structure element includes a semitransparent layer that comprises the first material.

14. The phase change mask of claim 13, wherein the first material comprises molybdenum silicide, and the second material comprises at least one of chromium and silver.

15. A phase mask for the projection or reflection of a structure into an image plane, the phase mask comprising a substrate, a first structure element supported by the substrate and comprising at least one semitransparent material, the first structure element having a first degree of transmission, and a second structure element supported by the substrate and comprising at least one semitransparent material, the second structure element having a second degree of transmission that is different from the first degree of transmission, wherein the first structure element is disposed within a depression within the substrate, the second structure element is disposed on a surface of the substrate, the first structure element comprises molybdenum silicide, and the second material comprises silver.

* * * * *